(12) United States Patent
Hiramoto

(10) Patent No.: US 7,645,643 B2
(45) Date of Patent: Jan. 12, 2010

(54) OPTICAL SEMICONDUCTOR DEVICE METHOD

(75) Inventor: Aki Hiramoto, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 107 days.

(21) Appl. No.: 11/276,093

(22) Filed: Feb. 14, 2006

(65) Prior Publication Data

US 2006/0118801 A1 Jun. 8, 2006

Related U.S. Application Data

(62) Division of application No. 10/691,705, filed on Oct. 24, 2003, now Pat. No. 7,078,734.

(30) Foreign Application Priority Data

Jun. 6, 2003 (JP) .............................. 2003-162112
Jul. 14, 2003 (JP) .............................. 2003-273963

(51) Int. Cl.
*H01L 21/00* (2006.01)
(52) U.S. Cl. ...................... 438/127; 438/124; 438/126; 257/E21.499; 257/E23.116
(58) Field of Classification Search .................. 438/26, 438/27, 637, 638, 124, 126, 127; 257/99, 257/100, E33.056, E33.057, E33.058, E33.059, 257/E21.579, E21.499, E23.116
See application file for complete search history.

(56) References Cited

U.S. PATENT DOCUMENTS 6,274,924 B1   8/2001   Carey et al.

| 6,593,598 | B2 * | 7/2003 | Ishinaga | 257/98 |
| 6,653,661 | B2 * | 11/2003 | Okazaki | 257/98 |
| 6,850,001 | B2 | 2/2005 | Takekuma | |
| 6,922,024 | B2 * | 7/2005 | Yano et al. | 315/291 |
| 6,924,514 | B2 * | 8/2005 | Suenaga | 257/98 |

(Continued)

FOREIGN PATENT DOCUMENTS

JP   02008070   1/1990

(Continued)

OTHER PUBLICATIONS

Office Action from Japanese Patent App. No. 2003-162112 (Mar. 3, 2009).

*Primary Examiner*—Michelle Estrada
(74) *Attorney, Agent, or Firm*—Cermak Kenealy Vaidya & Nakajima LLP

(57) ABSTRACT

A reliable optical semiconductor device can include an optical semiconductor chip sealed in a surrounding soft resin and in a hard resin that is harder than the soft resin. The hard resin can include an aperture that is configured to relieve a state of hermetic sealing for the soft resin (allows the soft resin to expand during volume change due to temperature fluctuations, etc.) and can be formed in a direction that imposes substantially no optical influence on a function of the optical semiconductor chip. The soft resin and the hard resin can be employed for double sealing to form the highly reliable optical semiconductor device without requiring additional space. This is effective to solve a problem caused in a conventional optical semiconductor device associated with double sealing by soft and hard resins, which requires a space between both resins and results in deteriorated performance, for example, a reduced amount of light.

18 Claims, 3 Drawing Sheets

U.S. PATENT DOCUMENTS

| | | | |
|---|---|---|---|
| 6,936,852 B2 * | 8/2005 | Furukawa et al. | 257/79 |
| 7,301,176 B2 * | 11/2007 | Abe et al. | 257/98 |
| 7,420,220 B2 * | 9/2008 | Ueda et al. | 257/98 |
| 7,425,727 B2 * | 9/2008 | Shoji et al. | 257/82 |

FOREIGN PATENT DOCUMENTS

| | | |
|---|---|---|
| JP | 5327029 | 12/1993 |
| JP | 7211940 | 8/1995 |
| JP | 09083018 | 3/1997 |
| JP | 9234728 | 9/1997 |
| JP | 10144965 | 5/1998 |
| JP | 10308535 | 11/1998 |
| JP | 11074561 | 3/1999 |
| JP | 11087780 | 3/1999 |
| JP | 2000249811 | 9/2000 |
| JP | 2002033517 | 1/2002 |
| JP | 2002094128 A * | 3/2002 |
| JP | 2002185046 | 6/2002 |
| JP | 2002-198570 | 7/2002 |
| JP | 2002198570 | 7/2002 |
| JP | 2002353511 | 12/2002 |
| JP | 2003008071 * | 10/2003 |

* cited by examiner

OPTICAL SEMICONDUCTOR DEVICE METHOD

This application is a divisional of, and claims priority under 35 U.S.C. §120 to, U.S. patent application Ser. No. 10/691,705 filed on Oct. 24, 2003 now U.S. Pat. No. 7,078,734, the disclosure of which is hereby incorporated herein in its entirety. This application also claims priority under 35 U.S.C. §119 of Japanese patent application No. JP 2003-162112 filed on Jun. 6, 2003 and Japanese patent application No. JP 2003-273963 filed on Jul. 14, 2003, which are hereby incorporated in their entirety by reference.

BACKGROUND OF THE INVENTION

1. Field of the Invention

The present invention relates to a method of manufacturing an optical semiconductor device that uses an optical semiconductor chip such as an LED lamp. More particularly, an embodiment of the optical semiconductor device is capable of preventing a semiconductor chip to be damaged from variations in environmental temperature, thus improving reliability and preventing deterioration in performance due to the improved reliability, thus allowing reliability and performance to exist together.

2. Description of the Related Art

When an improvement of reliability is intended in a conventional optical semiconductor device, an optical semiconductor chip is sealed in a first, relatively soft resinous member to improve resistances against shock and moisture. Further, the first resinous member is sealed in a second, relatively hard resinous member to improve the mechanical strength. In this way, two resins with different characteristics can be employed together to compensate for a function lacked in one from another and to improve the reliability. (See Patent Publication 1: JP-A-05/327029, paragraphs 5-7, FIG. 1, for example).

In the above conventional structure, however, when selecting the two resins, the relatively soft resin is commonly selected as the inner resin that directly contacts the optical semiconductor chip and the relatively hard resin as the outer resin to achieve the required mechanical strength.

In such a case, there is a difference in the thermal expansion coefficient between the soft resin and the hard resin. The difference may reach a factor of 10 times, depending on the case. Under a high-temperature ambient, the soft resin that is surrounded in the hard resin expands in volume and applies an excessive compressive pressure to the optical semiconductor ship. Therefore, a problem is caused because such pressure can be a factor in deterioration of the chip.

To avoid this and other problems, in a proposed optical semiconductor device 90 shown in FIG. 5, a space B can be provided between a soft resin 91 and a hard resin 92. This space is effective to prevent a compressive stress from being imposed on an optical semiconductor 93 even if a volume expansion occurs in the soft resin 91 as an environmental temperature elevates.

In the above example, the light emitted from (or coming into) the optical semiconductor chip 93 passes through the space B. That is, the light passes through air, which has a lower refractive index compared to the resin. In this case, reflection can occur at an interface between the resin, and the air can cause a loss in amount of light, resulting in an output reduction of about 25-35%. Such an output reduction causes a problem associated with deterioration of the performance of the optical semiconductor device.

As for the soft resin 91 and the holder 94, a difference in expansion coefficient between respective materials can also cause a problem because it may form peeled or cracked parts in the product.

The holder 94 commonly employs a lead-frame-insert injection-molded product in its structure. In this molding method, an air layer can be interposed between the frame and the insert-molded product. The air layer expands under a high-temperature ambient and applies pressure to the soft resin, which produces bubbles therein. The production of bubbles causes a problem because it lowers the optical output similar to the above case and deteriorates the performance of the optical semiconductor device.

SUMMARY OF THE INVENTION

The above and other conventional problems can be solved or abated by providing an optical semiconductor device, which can include an optical semiconductor chip sealed in a surrounding soft resin. A holder can be formed around the soft resin and integrally with a lead frame, and a covering lens composed of a transparent resin harder than the soft resin can be provided. The holder can include an aperture configured to relieve a state of hermetic sealing for the soft resin and formed in a direction that imposes no optical influence on a function of the optical semiconductor chip. In the optical semiconductor device, the lead frame may protrude into the aperture of the holder so as to occupy an inner rim of the aperture at a ratio below ½ in length. Thus, the above and other problems can be solved or abated while also improving reliability in a semiconductor device without a resulting deterioration of performance.

BRIEF DESCRIPTION OF THE DRAWINGS

These and other characteristics and features of the invention will become clear from the following description with reference to the accompanying drawings, wherein.

DETAILED DESCRIPTION OF PREFERRED EMBODIMENTS

Figure 1:
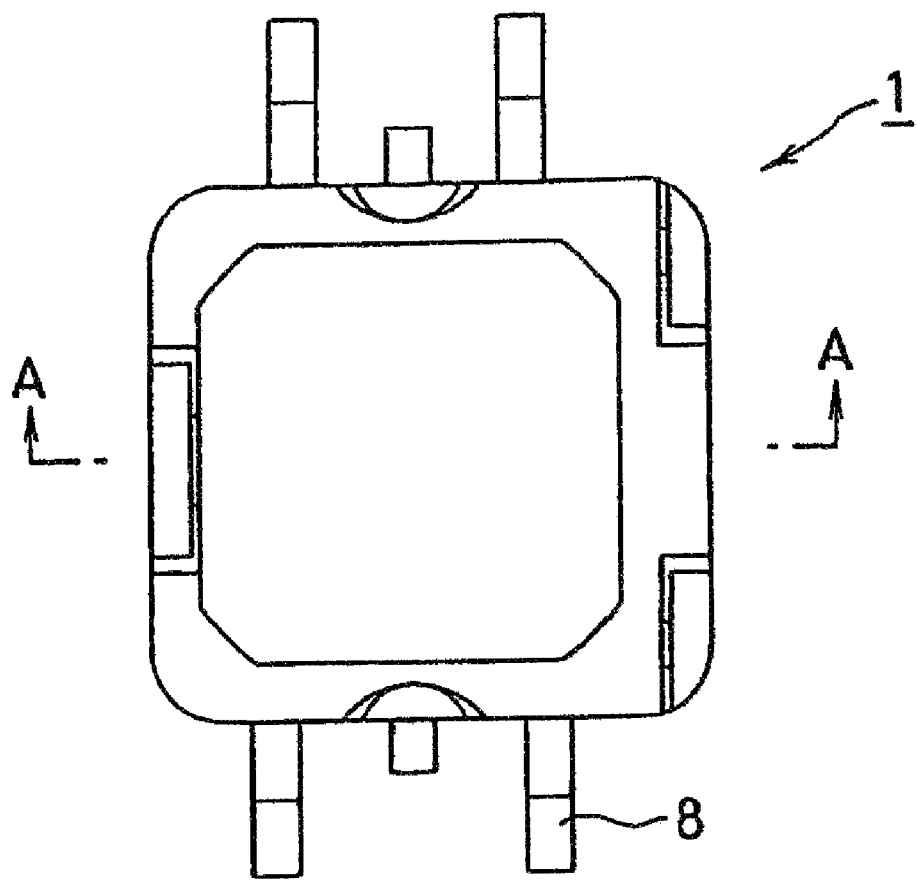
FIG. 1 is a plan view showing an embodiment of an optical semiconductor device according to the invention.

Next, exemplary embodiments of the invention will be described with reference to the accompanying drawings. In the drawings, the same reference numerals will be used to show the same or similar elements in the various embodiments shown in the drawings.

Figure 2:
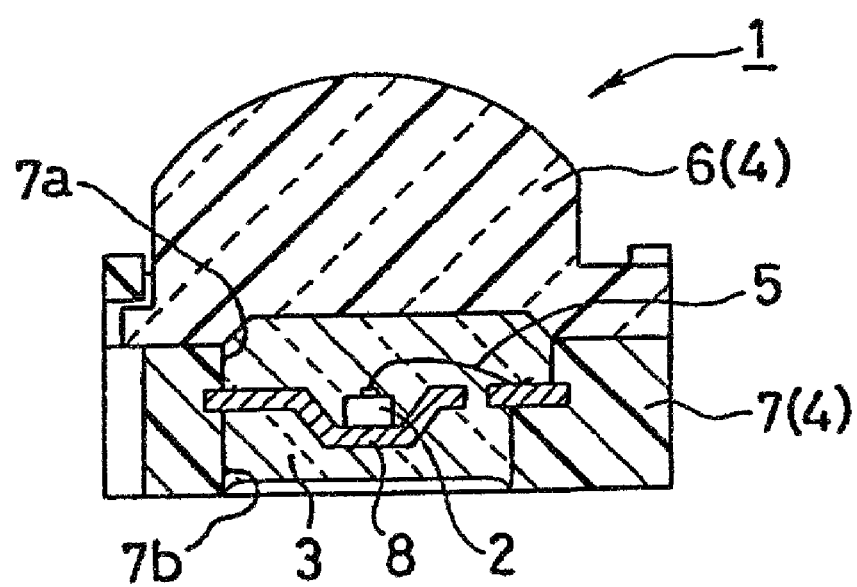
FIG. 2 is a cross-sectional view taken along the A-A line in FIG. 1.

In FIGS. 1 and 2, the reference numeral 1 denotes an embodiment of an optical semiconductor device made in accordance with principles of the invention. The optical semiconductor device 1 can include an optical semiconductor chip 2, which is double sealed in a relatively softer soft resin 3 and in a relatively harder hard resin 4.

The optical semiconductor chip 2 can be entirely surrounded by the soft resin 3 and blocked from air to prevent the optical semiconductor chip 2 from deteriorating from moisture in the atmosphere. The optical semiconductor chip 2 can be wired using a fine-diameter gold wire 5. Accordingly, it is covered in the soft resin 3 to prevent the gold wire 5 from being broken or peeled from the optical semiconductor chip 2 due to vibrations.

The optical semiconductor chip 2 thus covered in the soft resin 3 can be further externally covered by the hard resin 4 to improve the mechanical strength, which prevents deformation of the soft resin 3 due to external stress and further ensures the improvement of reliability. Preferably, the hard resin 4 has a characteristic for reinforcing weaknesses in the soft resin 3 such as a chemical resistance, and improves the reliability based on points other than the external stress.

If bubbles arise, they can be released from the product through the aperture.

An aperture can be provided as a means for avoiding an excessive elevation in compressive stress imposed on the optical semiconductor chip 2 caused at a high temperature by a difference in expansion coefficient between the soft resin 3 and the hard resin 4. If the optical semiconductor chip 2 is a light-emitting element, the aperture can be provided at a location that is not involved in an optical path for a light emitted from the optical semiconductor chip 2. If the optical semiconductor chip 2 is a photo-detecting element, the aperture can be provided at a location that is not involved in an optical path for an external light coming into the optical semiconductor chip 2.

The above structure can be described more specifically. In the actual process of manufacturing the highly reliable optical semiconductor device 1, the part composed of the hard resin 4 can be divided into a lens 6 and a holder 7, both of which can be previously formed. A lead frame 8 can be provided for mounting the optical semiconductor chip 2 thereon.

The lead frame can be integrally formed with the holder 7 and wired via gold wire 5 (or other type of wire). The holder 7 can be provided with aperture 7a for mounting the optical semiconductor chip 2, which can be formed in various places, including the front side, or the side that is to be combined with the lens 6, as described later. Another aperture 7b can be formed in at another location, such as at the rear side for relieving the compressive stress imposed on the optical semiconductor chip 2.

After the optical semiconductor chip 2 is mounted as above, the holder 7 is coupled to the lens 6 using an appropriate coupling means such as a hook structure. Accordingly, the aperture 7a provided in front of the optical semiconductor chip 2 is closed by the lens 6, and only the aperture 7b provided at the rear side remains open.

Soft resin 3 such as a silicone resin can be injected through the aperture 7b and, after degassing, heated to achieve an appropriate hardness. Such processes can produce the construction of an embodiment of the optical semiconductor device. The construction can include forming soft resin 3 to surround the whole optical semiconductor chip 2. The hard resin 4 (the lens 6 and the holder 7) can be formed to surround the soft resin 3 except for the aperture 7b, where the optical semiconductor chip 2 does not function.

Figure 3:
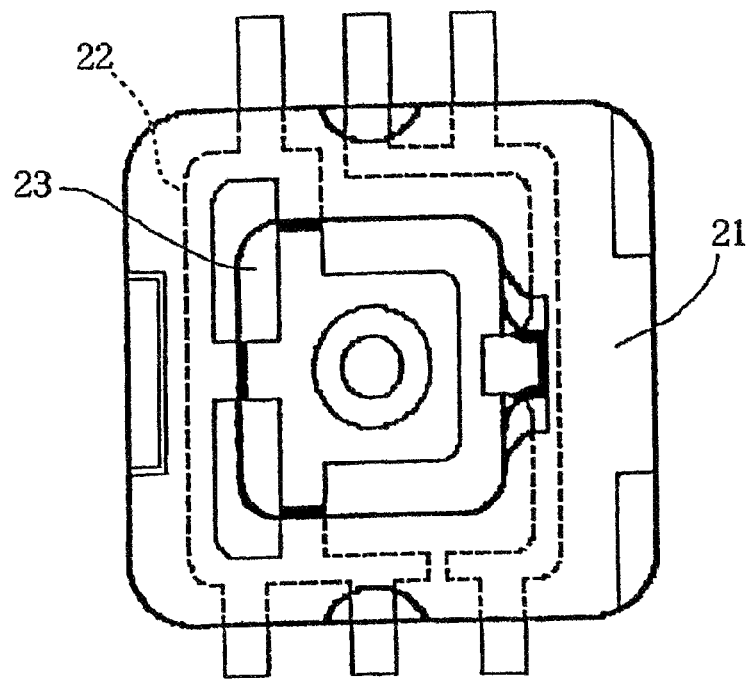
FIG. 3 illustrates a layout of an aperture in a holder and a lead frame.

FIG. 3 shows a layout of the holder 7. The reference numeral 21 denotes a holder, 22 a lead frame, and 23 an aperture. The lead frame 22 can be configured to protrude into the aperture 23 in the holder 21 so as to occupy an inner rim of the aperture 23 at a ratio below ½ in length of the inner rim of the aperture 23. The lead frame 22 is so formed by appropriately shaping the part sealed in the holder 21 and the part protruded into the aperture 23.

Figure 4:
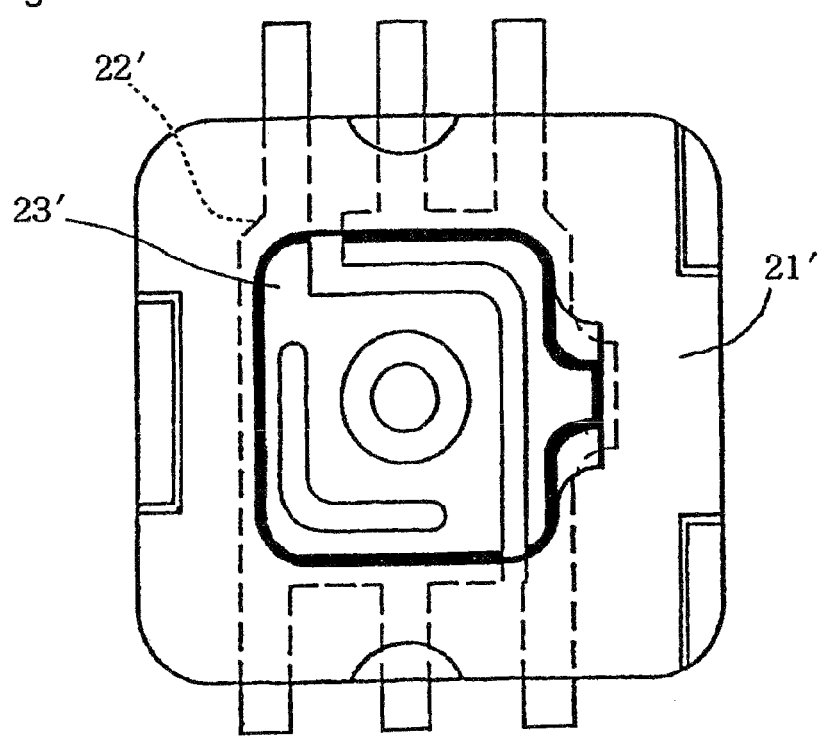
FIG. 4 illustrates the aperture and the lead frame almost entirely contacting the whole rim thereof.
Figure 5:
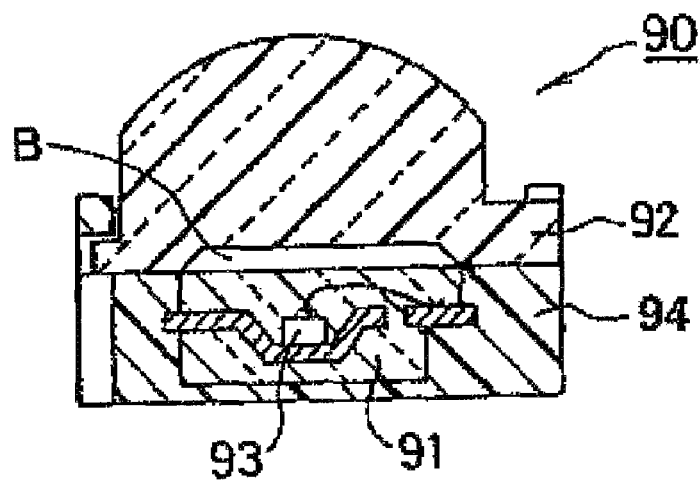
FIG. 5 is a cross-sectional view of a conventional example.

FIG. 4 shows a reference example, in which a lead frame almost entirely contacts the whole rim of an aperture in a molded holder. The reference numeral 21' denotes a holder, 22' a lead frame, and 23' an aperture.

As shown in FIG. 3, the inner rim of the holder 21, which forms the aperture 23, can include portions (parts of the bold line in FIG. 3) where the lead frame 22 contacts the inner wall of the holder 21. Reducing these portions to be as small as possible is effective to reduce an interface between the lead frame 22 and the holder 21 to prevent production of bubbles. The effect can be confirmed when the lead frame 22 partly contacts the inner wall of the holder in length in the circumferential direction at a ratio below about ½ the length of the inner rim in the holder 21 shown in FIG. 3.

Operation and effect of the highly reliable optical semiconductor device 1 thus configured will be described next. First, the optical semiconductor chip 2 can be entirely surrounded by and sealed in the soft resin 3 such as a silicone resin for blocking the atmosphere to prevent deterioration due to moistures and toxic gases. The soft resin 3 is sufficiently flexible soas to protect the optical semiconductor chip 2 from external vibrations.

The hard resin 4 (the lens 6 and the holder 7) can be provided with the aperture 7b as described above and accordingly can be configured to not hermetically seal the soft resin 3. Therefore, even if the soft resin 3 has a larger thermal expansion coefficient, an expansion in the volume of the soft resin 3 caused from environmental temperature increase, for example, can extend through the aperture 7b and imposes no pressure elevation on the optical semiconductor chip 2.

When a contraction occurs in volume of the soft resin 3 along with the environmental temperature decrease, as the soft resin 3 has a free end in the aperture 7b, its volume can contract without forming any space due to the contraction at another end near the lens 6. Therefore, little or no air layer is formed in an optical path extending from the optical semiconductor chip 2 through the soft resin 3 to the lens 6 (the hard lens 4). Otherwise, an air layer can cause a loss of about 30%.

It is possible to reduce a contact area between the holder and the soft resin. Therefore, even when a stress arises, its force can escape through the aperture 7b so as to reduce occurrences of peels and cracks in the product relative to the conventional example.

In addition, the inner rim of the holder 21, which can be used to form the aperture 23, includes portions (parts of the bold line in FIG. 3) where the lead frame 22 contacts the inner wall of the holder 21. Reducing such portions to be as small as possible is effective to reduce an interface between the lead frame 22 and the holder 21 to prevent production of bubbles. The reduced area of the lead frame 22 in the aperture 23 has an accompanying positive effect on a reduction of flow resistance against the soft resin injection and reduction in damage suffered by the gold wire and the optical semiconductor chip 2.

As described above, the optical semiconductor device can include an optical semiconductor chip sealed in a surrounding soft resin; a holder composed of a hard resin harder than the soft resin and formed around the soft resin and integrally with a lead frame; and a covering lens composed of a transparent resin. The holder can include an aperture configured to relieve a state of hermetic sealing for the soft resin and formed in a direction that imposes little or no optical influence on a function of the optical semiconductor chip. In the optical semiconductor device, the lead frame can be configured to protrude into the aperture of the holder so as to occupy an inner rim of the aperture at a ratio below ½ in length. Therefore, on formation of a highly reliable optical semiconductor device double sealed with soft and hard resins, the double sealing can be achieved without providing any space that reduces reliability of the device. Thus, an extremely superior effect can be expected to improve performance without a loss in amount of the light emitted from or coming into the optical semiconductor chip.

The lead frame can be designed to partly contact the inner wall of the holder in length in the circumferential direction at a ratio below about ½ the length of the inner rim in the holder that forms the aperture. This is effective to reduce the interface between the lead frame 22 and the holder 21 to prevent production of bubbles and make the optical semiconductor device highly reliable. Further, the flow resistance against the soft resin injection can be reduced effectively to reduce damage suffered by the gold wire and the optical semiconductor chip.

While there has been described what are at present considered to be exemplary embodiments of the invention, it will be understood that various modifications may be made thereto, and it is intended that the appended claims cover all such modifications as fall within the true spirit and scope of the invention. All conventional art references described above are herein incorporated in their entirety by reference.

What is claimed is:

1. A method of making an optical semiconductor device, comprising:
   providing a holder composed of a hard resin that includes an aperture and a lead frame located therein;
   connecting a semiconductor chip to the lead frame;
   injecting a soft resin softer than said hard resin into the aperture to seal the semiconductor chip thereby forming a space below the semiconductor chip in the aperture allowing stress caused by the soft resin expanded when at high temperature to be released from the space;
   providing a second hard resin structure adjacent a top portion of the holder, said second hard resin being harder than said soft resin, wherein the second hard resin structure covers and is located on an upper portion of the soft resin; and
   blocking a surface of the soft resin that opposes the space below the semiconductor chip by placing the second hard resin structure at a location such that the hard resin and the second hard resin structure prevents the soft resin from expanding in a direction away from the space below the semiconductor chip while simultaneously allowing the soft resin when at high temperature to expand in a direction towards and into the space below the semiconductor chip.

2. The method of claim 1, further comprising:
   forming the second hard resin structure as a covering lens, and attaching the covering lens to a front of the holder above the semiconductor chip.

3. The method of claim 1, further comprising:
   degassing the soft resin after injecting the soft resin into the aperture.

4. The method of claim 1, further comprising:
   heating the soft resin after injecting the soft resin into the aperture.

5. A method of making an optical semiconductor device, comprising:
   providing a holder composed of a hard resin that includes an aperture and a lead frame located therein;
   connecting a semiconductor chip to the lead frame;
   injecting a soft resin softer than said hard resin into the aperture to seal the semiconductor chip thereby forming a space below the semiconductor chip in the aperture allowing stress caused by the soft resin expanded when at high temperature to be released from the space,
   wherein providing the lead frame includes occupying an inner rim of the aperture with the lead frame at a ratio below ½ in length.

6. The method of claim 1, wherein providing a holder includes forming the aperture to define the space into which the soft resin can expand.

7. A method of making an optical semiconductor device, comprising:
   providing a holder composed of a hard resin that includes an opening and a lead frame located therein;
   connecting a semiconductor chip to the lead frame;
   injecting a soft resin softer than said hard resin into the opening to seal the semiconductor chip;
   providing a space adjacent the soft resin such that the soft resin can expand into the space during operation of the optical semiconductor device;
   providing a second hard resin structure adjacent a top portion of the holder, said second hard resin being harder than said soft resin, wherein the second hard resin structure covers and is located adjacent an upper portion of the soft resin; and
   forming the second hard resin structure as a covering lens, and attaching the covering lens to a front of the holder above the semiconductor chip
   wherein providing a space includes providing a space located between a top surface of the soft resin and the covering lens.

8. A method of making an optical semiconductor device, comprising:
   providing a holder composed of a hard resin that includes an opening and a lead frame located therein;
   connecting a semiconductor chip to the lead frame;
   injecting a soft resin softer than said hard resin into the opening to seal the semiconductor chip;
   providing a space adjacent the soft resin such that the soft resin can expand into the space during operation of the optical semiconductor device;
   providing a second hard resin structure adjacent a top portion of the holder, said second hard resin being harder than said soft resin, wherein the second hard resin structure covers and is located adjacent an upper portion of the soft resin;
   forming the second hard resin structure as a covering lens, and attaching the covering lens to a front of the holder above the semiconductor chip,
   wherein providing a space includes providing an indent in the covering lens.

9. The method of claim 5, further comprising:
   degassing the soft resin after injecting the soft resin into the aperture.

10. The method of claim 5, further comprising:
    heating the soft resin after injecting the soft resin into the aperture.

11. The method of claim 1, wherein providing a lead frame includes occupying an inner rim of the aperture with the lead frame at a ratio below ½ in length.

12. The method of claim 5, wherein providing a holder includes forming the aperture to define the space into which the soft resin can expand.

13. The method of claim 1, further comprising:
    mounting the holder to a mount structure such that the space is formed between a bottom surface of the soft resin and the mount structure.

14. The method of claim 1, wherein the space is open to the atmosphere.

15. The method of claim 1, wherein forming a space includes providing a space not involved in an optical path of the semiconductor chip.

16. The method of claim 1, further comprising:
   forming the second hard resin structure as a covering lens composed of a transparent resin; and
   providing a structure adjacent the covering lens to prevent movement of the covering lens in a direction away from the hard resin.

17. The method of claim 5, further comprising:
   forming the second hard resin structure as a covering lens composed of a transparent resin; and
   providing a structure adjacent the covering lens to prevent movement of the covering lens in a direction away from the hard resin.

18. The method of claim 5, further comprising:
   attaching a second hard resin structure adjacent a top portion of the holder, said second hard resin being harder than said soft resin, wherein the second hard resin structure covers and is located adjacent an upper portion of the soft resin, and
   blocking a surface of the soft resin that opposes the space below the semiconductor chip by placing the second hard resin structure at a location such that the hard resin and the second hard resin structure prevents the soft resin from expanding in a direction away from the space below the semiconductor chip while simultaneously allowing the soft resin when at high temperature to expand in a direction towards and into the space below the semiconductor chip.

* * * * *